United States Patent
Hirano et al.

(10) Patent No.: US 10,468,389 B2
(45) Date of Patent: Nov. 5, 2019

(54) DISPLAY DEVICE AND IMAGING DEVICE

(71) Applicant: Sony Semiconductor Solutions Corporation, Kanagawa (JP)

(72) Inventors: Takaaki Hirano, Kanagawa (JP); Teppei Imamura, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 1 day.

(21) Appl. No.: 15/553,324

(22) PCT Filed: Feb. 1, 2016

(86) PCT No.: PCT/JP2016/052918
§ 371 (c)(1),
(2) Date: Aug. 24, 2017

(87) PCT Pub. No.: WO2016/140002
PCT Pub. Date: Sep. 9, 2016

(65) Prior Publication Data
US 2018/0247920 A1 Aug. 30, 2018

(30) Foreign Application Priority Data

Mar. 2, 2015 (JP) .................. 2015-039922

(51) Int. Cl.
*G09F 9/302* (2006.01)
*H01L 25/075* (2006.01)
(Continued)

(52) U.S. Cl.
CPC ............ *H01L 25/0753* (2013.01); *G09F 9/00* (2013.01); *G09F 9/3026* (2013.01);
(Continued)

(58) Field of Classification Search
CPC . H01L 33/46; H01L 27/3246; H01L 27/3244; H01L 27/12; H01L 51/524;
(Continued)

(56) References Cited

U.S. PATENT DOCUMENTS 6,249,267 B1    6/2001 Ishihara
2004/0075380 A1*    4/2004 Takemoto ........... H01L 51/5221
                                                                313/500
(Continued)

FOREIGN PATENT DOCUMENTS

JP    09-223820 A    8/1997
JP    10-308484 A    11/1998
(Continued)

OTHER PUBLICATIONS

International Search Report and Written Opinion and English translation thereof dated Apr. 5, 2016 in connection with International Application No. PCT/JP2016/052918.
(Continued)

*Primary Examiner* — Roy K Potter
(74) *Attorney, Agent, or Firm* — Wolf, Greenfield & Sacks, P.C.

(57) ABSTRACT

A display device (1) includes a substrate (11) having a first surface (S1) and a second surface (S2) that face each other, and having a plurality of light emitting elements (10A) on the first surface, a mounting member (12) disposed to face a portion of the second surface of the substrate, and a base (13) adhered to the second surface of the substrate, and having a depressed portion (13a) that faces the mounting member.

19 Claims, 12 Drawing Sheets

(51) Int. Cl.
  *G09F 9/00* (2006.01)
  *H01L 23/00* (2006.01)
  *H01L 25/04* (2014.01)
  *H01L 25/13* (2006.01)
  *H01L 27/146* (2006.01)
  *H01L 31/02* (2006.01)
  *H01L 31/024* (2014.01)
  *H01L 33/62* (2010.01)
  *H01L 33/64* (2010.01)

(52) U.S. Cl.
  CPC .......... *H01L 23/562* (2013.01); *H01L 25/042* (2013.01); *H01L 25/13* (2013.01); *H01L 27/14636* (2013.01); *H01L 27/14643* (2013.01); *H01L 31/024* (2013.01); *H01L 31/02005* (2013.01); *H01L 33/62* (2013.01); *H01L 33/642* (2013.01); *H01L 33/644* (2013.01); *H01L 33/641* (2013.01); *H01L 2224/73204* (2013.01); *H01L 2224/73253* (2013.01)

(58) Field of Classification Search
  CPC .............. H04N 5/378; G02F 1/133603; G02F 1/133308; G02F 2001/133314; G02F 2001/133317; G02F 2201/54
  See application file for complete search history.

(56) References Cited

U.S. PATENT DOCUMENTS

| | | | |
|---|---|---|---|
| 2010/0177259 A1* | 7/2010 | Ichioka | G02F 1/133308 349/58 |
| 2011/0169393 A1* | 7/2011 | Gyoda | H01L 25/048 313/46 |
| 2012/0248294 A1* | 10/2012 | Kohama | H01L 27/14618 250/214 P |
| 2016/0265758 A1* | 9/2016 | Funakoshi | H05K 1/0209 |

FOREIGN PATENT DOCUMENTS

| | | |
|---|---|---|
| JP | 2005-094637 A | 4/2005 |
| JP | 2009-004275 A | 1/2009 |
| JP | 2013-004389 A | 1/2013 |
| JP | 2014-209198 A | 11/2014 |
| WO | WO 2008/117334 A1 | 10/2008 |

OTHER PUBLICATIONS

International Preliminary Report on Patentability and English translation thereof dated Sep. 14, 2017 in connection with International Application No. PCT/JP2016/052918.

* cited by examiner

[ FIG. 1 ]
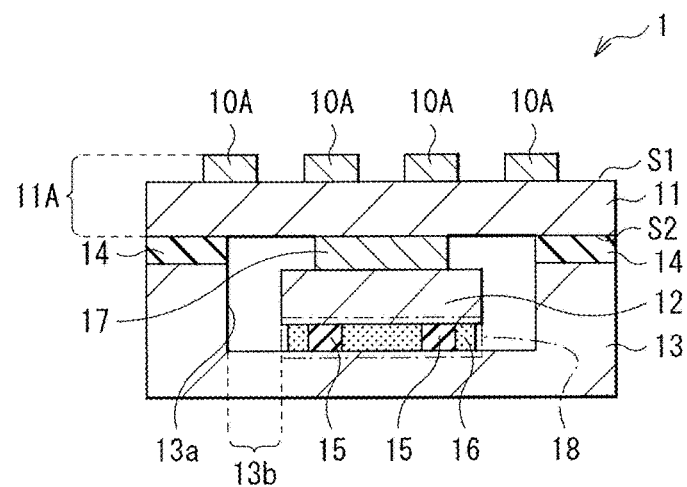
[ FIG. 2 ]
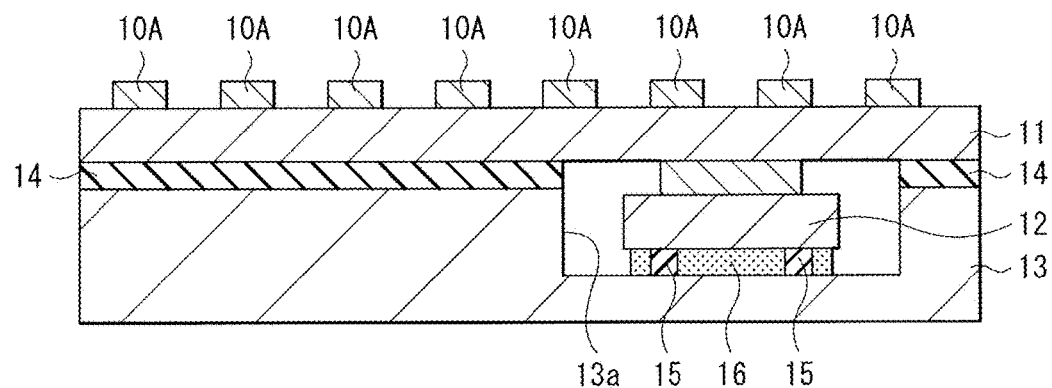

[ FIG. 3 ]
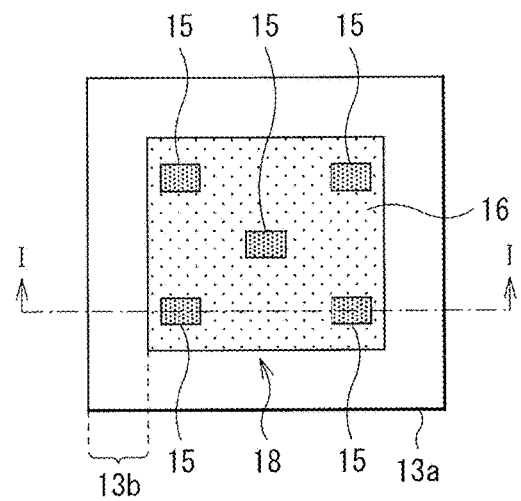
[ FIG. 4 ]
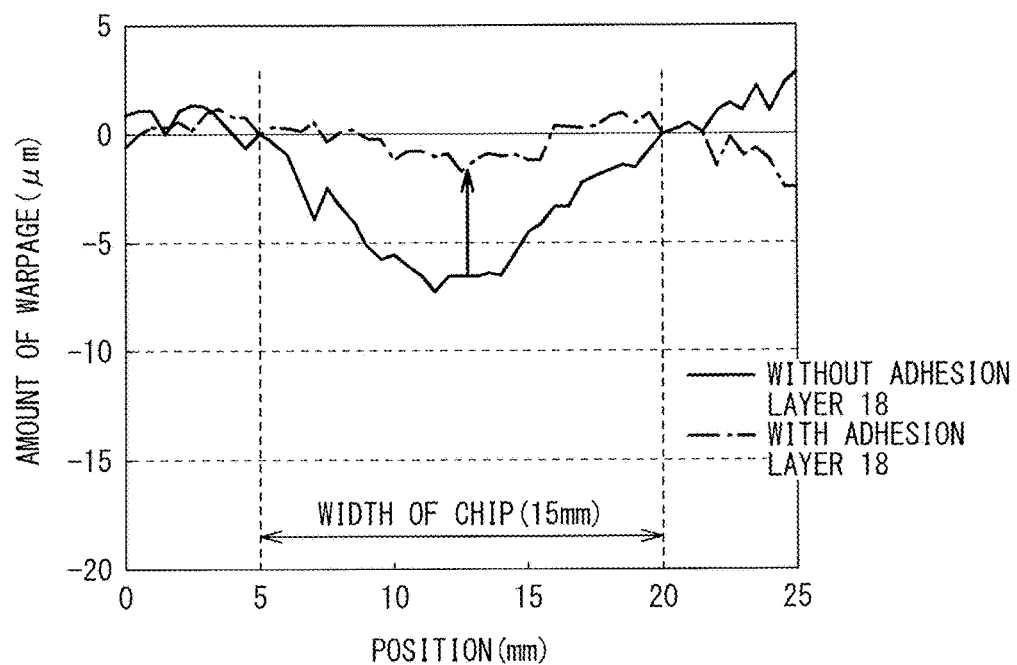

[ FIG. 5A ]
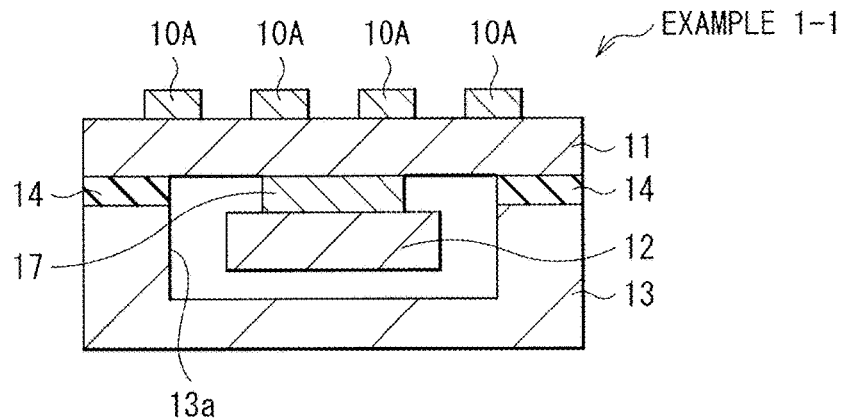
[ FIG. 5B ]
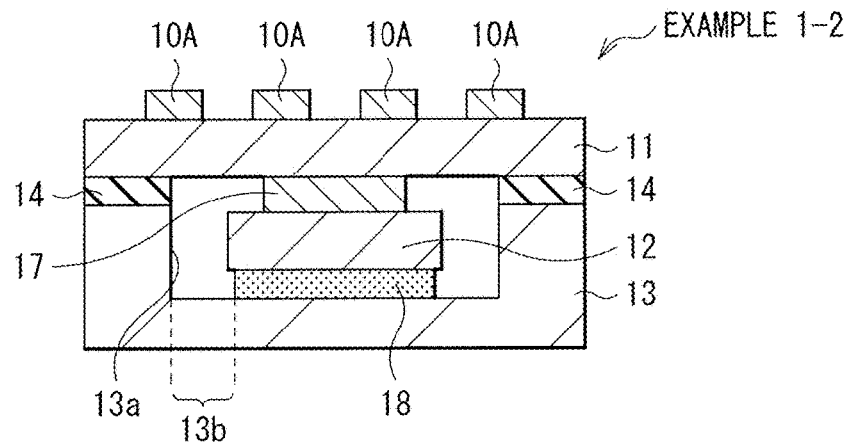
[ FIG. 5C ]
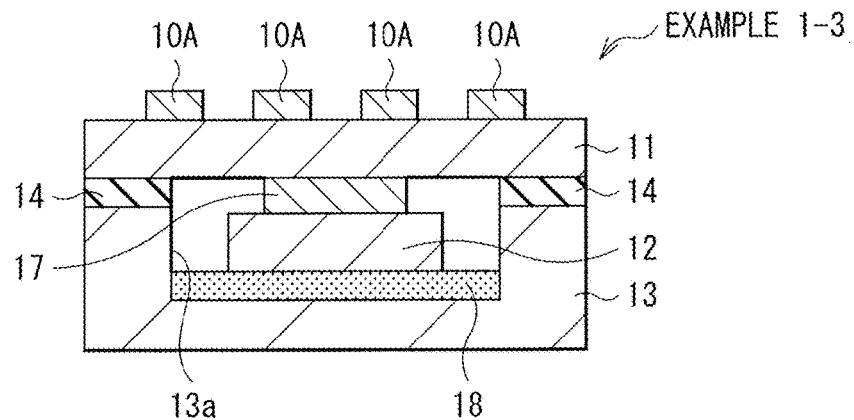

[ FIG. 5D ]
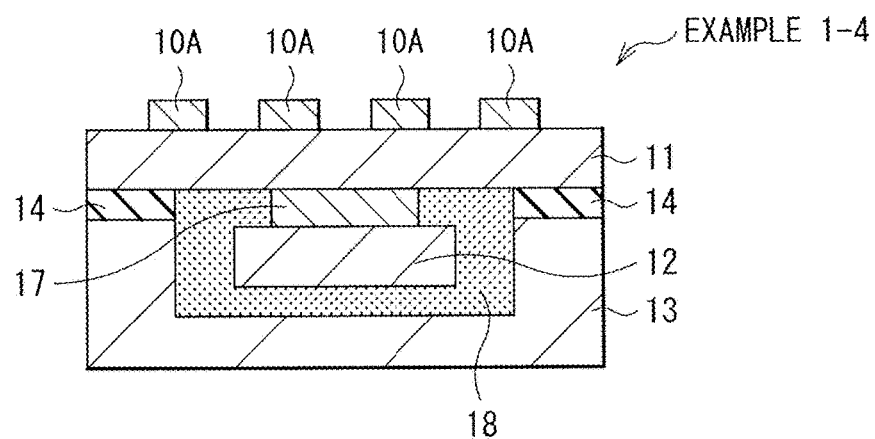
[ FIG. 6 ]
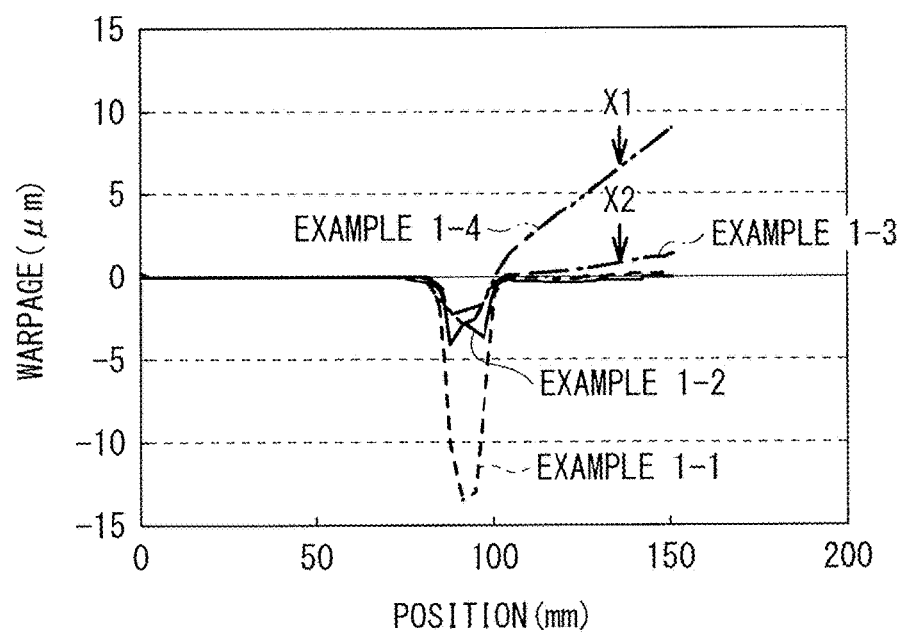

[ FIG. 7 ]
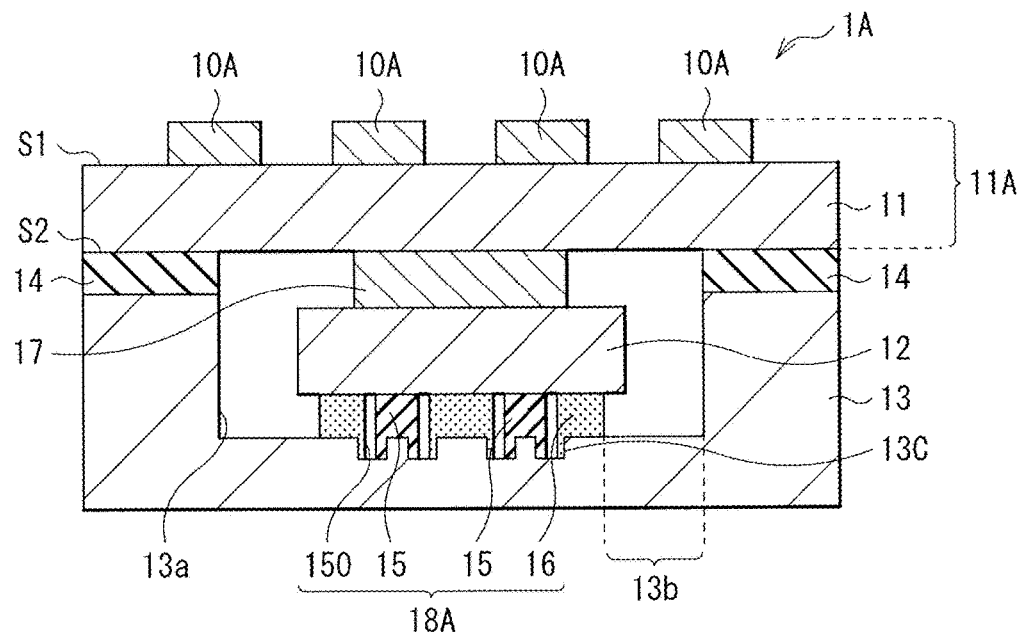
[ FIG. 8 ]
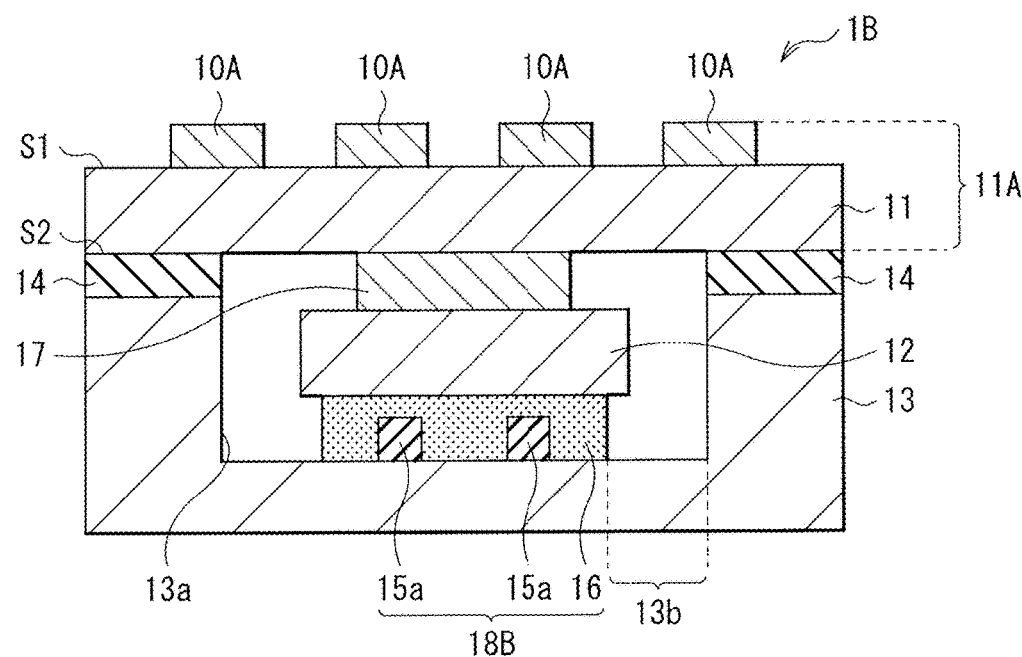

[ FIG. 9 ]
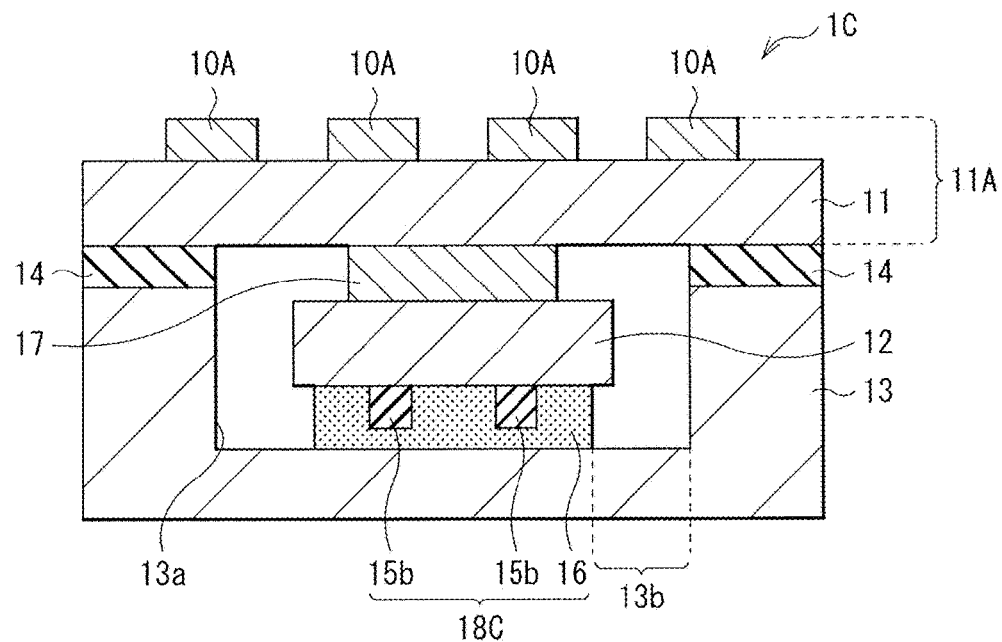
[ FIG. 10 ]
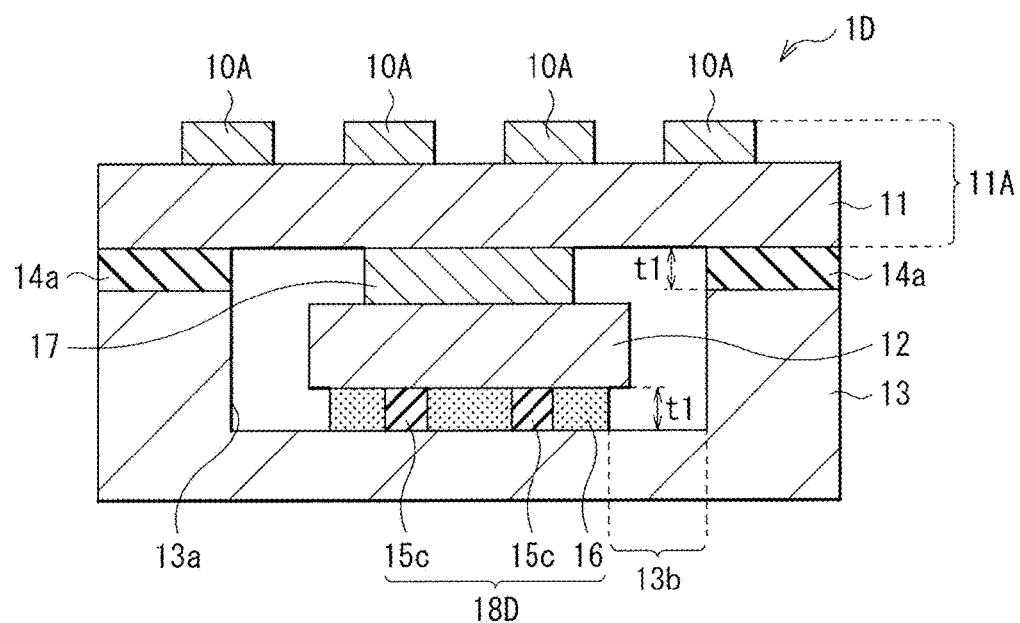

[ FIG. 11 ]
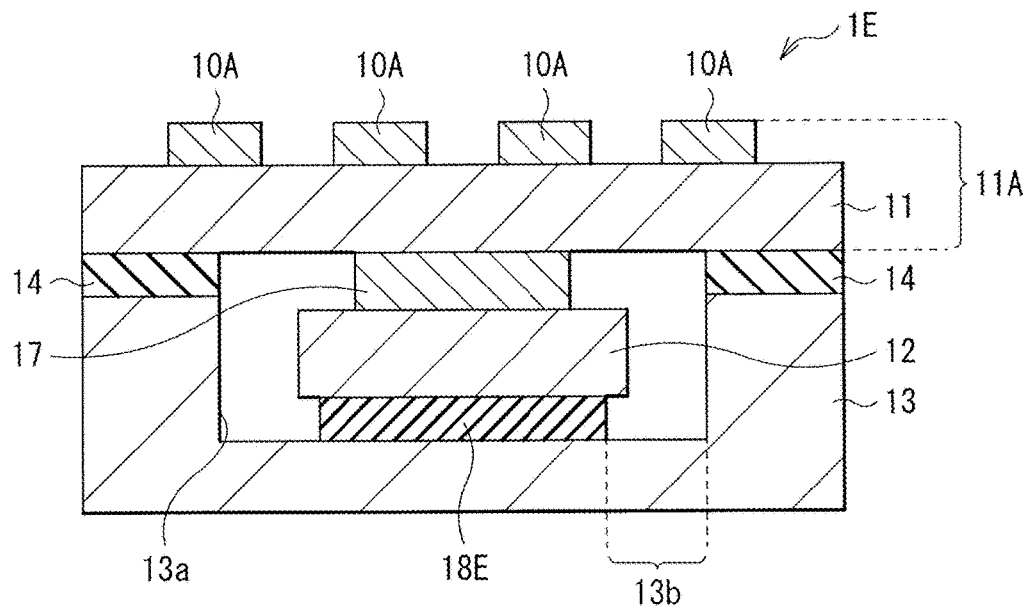
[ FIG. 12 ]
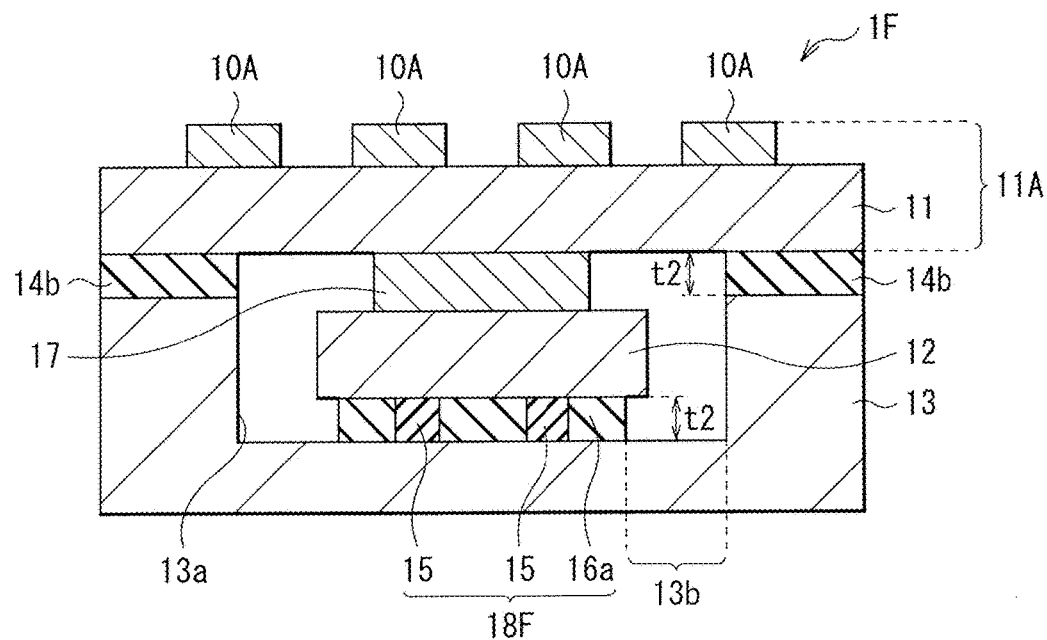

[ FIG. 13 ]
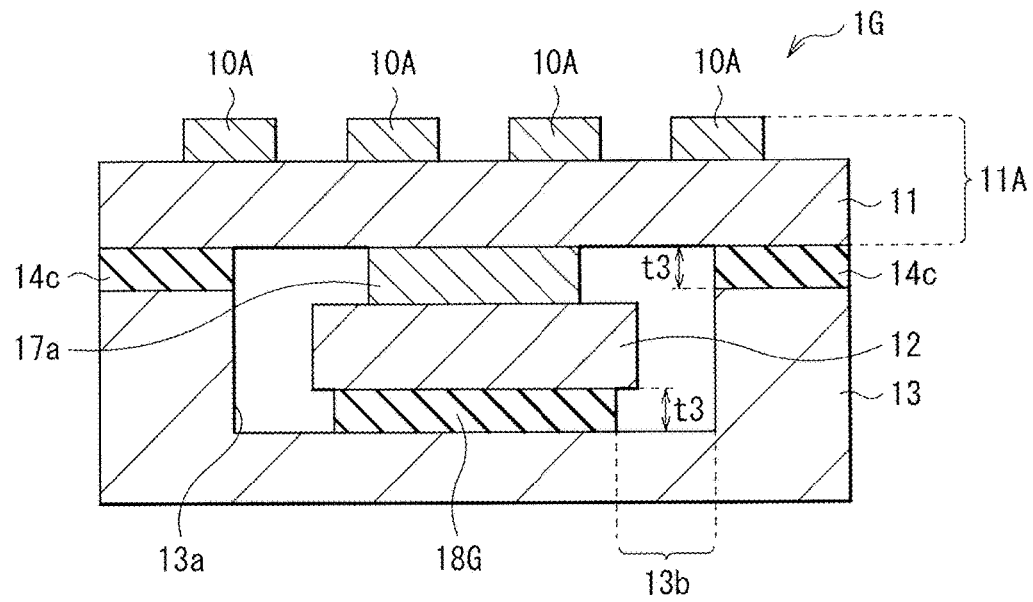
[ FIG. 14 ]
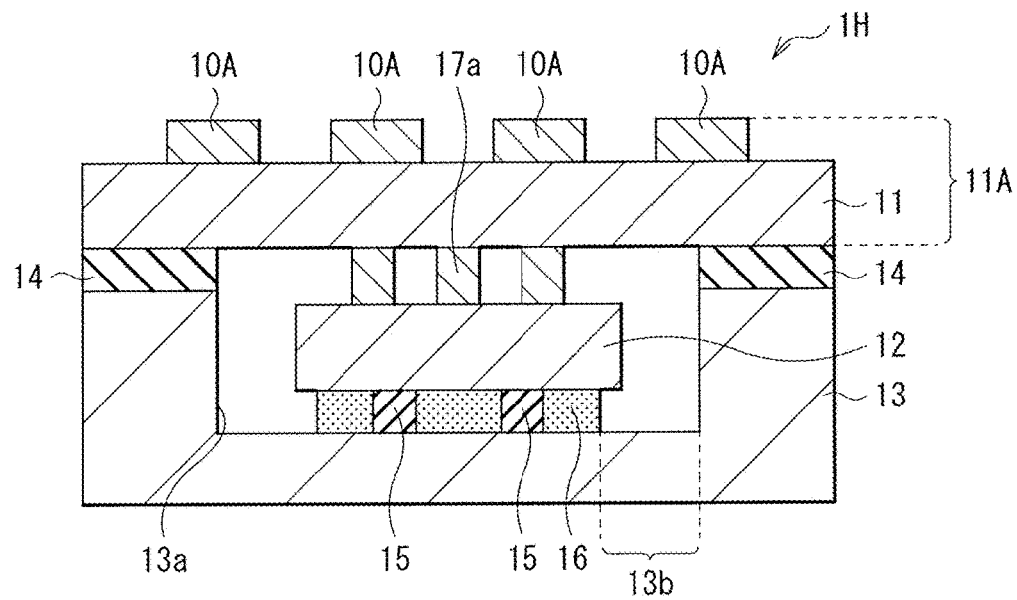

[ FIG. 15 ]
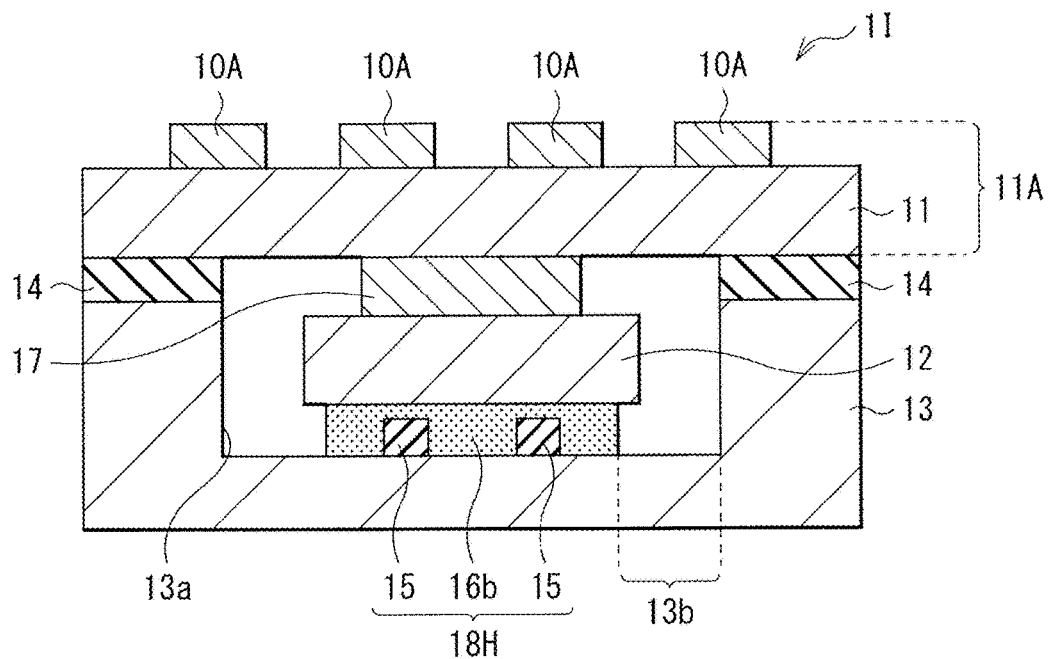
[ FIG. 16A ]
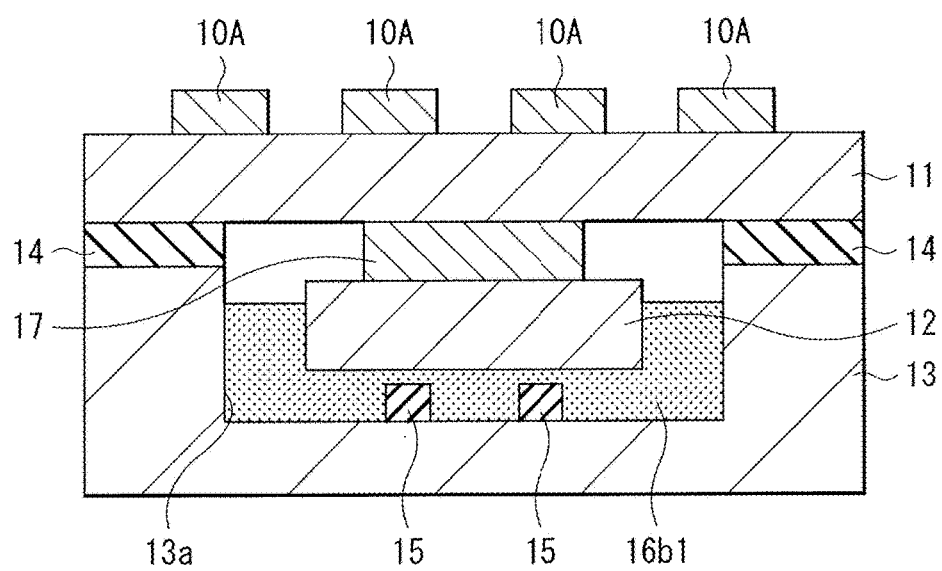

[ FIG. 16B ]
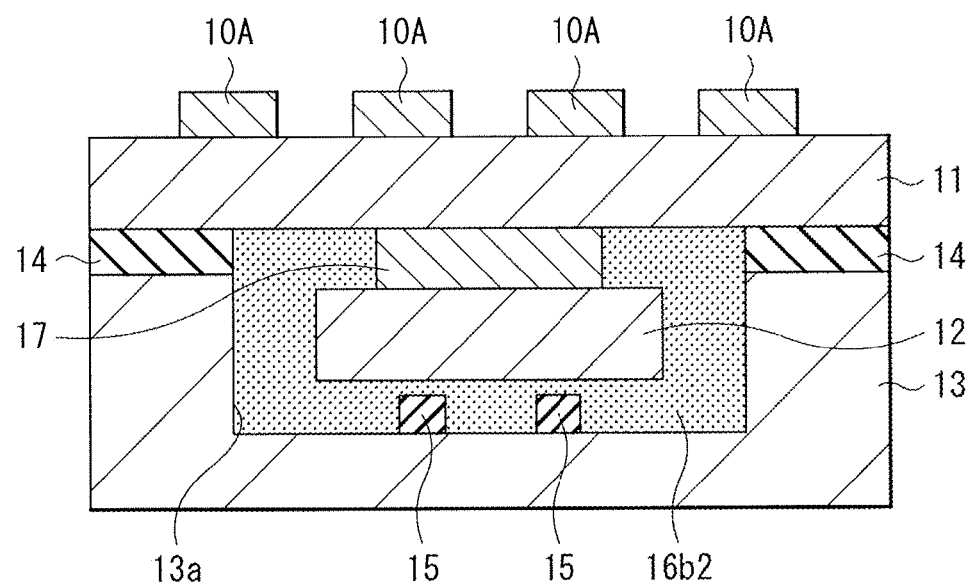
[ FIG. 17 ]
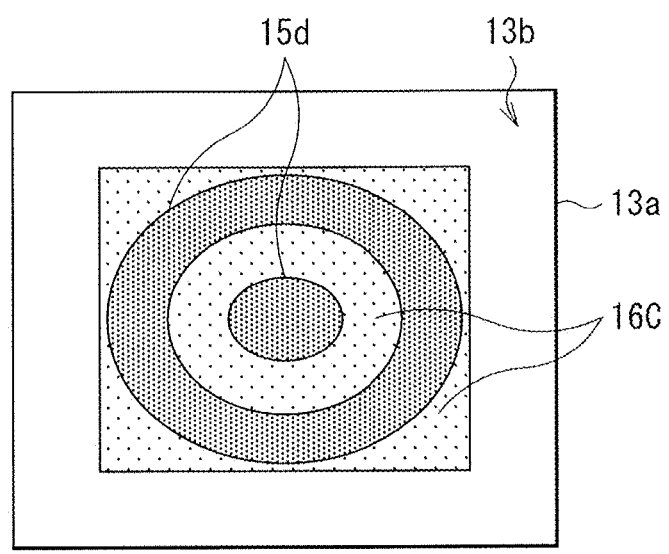

[ FIG. 18 ]
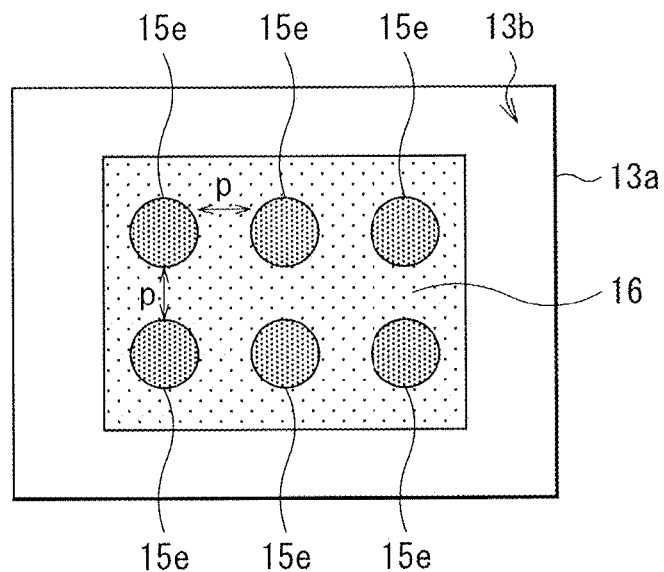
[ FIG. 19 ]
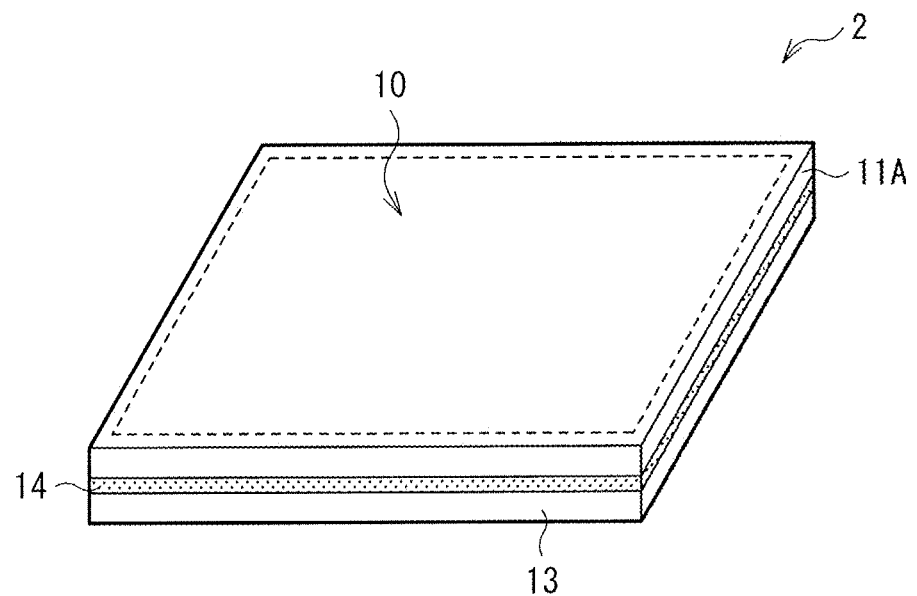

[ FIG. 20 ]
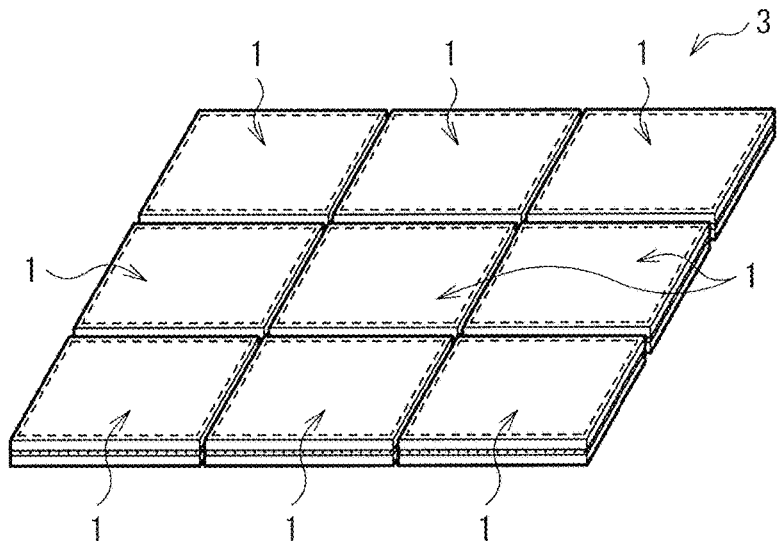
[ FIG. 21 ]
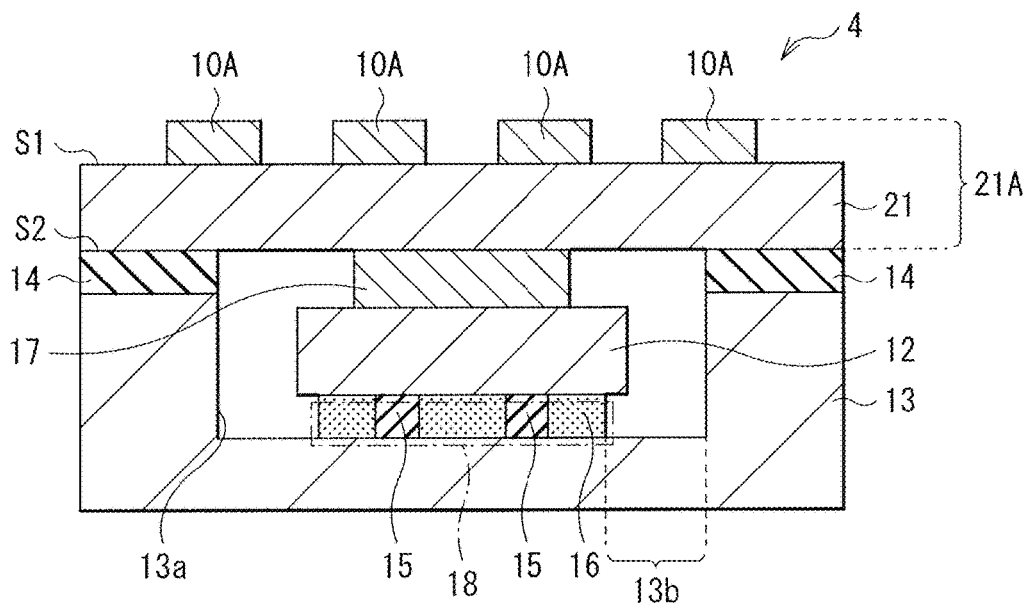

DISPLAY DEVICE AND IMAGING DEVICE

CROSS-REFERENCE TO RELATED APPLICATIONS

This application is a National Stage of International Application No. PCT/JP2016/052918, filed in the Japanese Patent Office as a Receiving office on Feb. 1, 2016, which claims priority to Japanese Patent Application Number 2015-039922, filed in the Japanese Patent Office on Mar. 2, 2015, each of which is hereby incorporated by reference in its entirety.

TECHNICAL FIELD

The disclosure relates to a display device or an imaging device in which a surface-mounted component is provided on a back surface of a substrate on which elements are formed.

BACKGROUND ART

In recent years, a display device (a tiling display) in which a plurality of display elements (in the following, referred to as "cells") are arranged in form of tiles has been proposed (for example, Patent Literature 1). In the tiling display, light emitting elements such as light emitting diodes (LEDs) are disposed side by side on the substrate cell by cell. There is an example (Patent Literature 2) in which, for example, a glass epoxy substrate is used as the substrate of the cells for cost reduction and routing of wiring.

CITATION LIST

Patent Literature

Patent Literature 1: Japanese Unexamined Patent Application Publication No. 2009-4275
Patent Literature 2: Japanese Unexamined Patent Application Publication No. 2014-209198

SUMMARY OF THE INVENTION

However, in the display device of the type as mentioned above, there is such a concern that the substrate is deformed due to changes in environment such as temperature and humidity and thereby a display screen is distorted and image quality is deteriorated. In particular, in a case where a mounting member is provided on the back surface of the substrate, warpage occurs on a local portion of the substrate.

Therefore, it is desirable to provide a display device or an imaging device that makes it possible to reduce image quality deterioration caused by hygrothermal environment, temperature rising when driven, thermal stress in a manufacturing process and so forth.

A display device according to one embodiment of the disclosure includes: a substrate having a first surface and a second surface that face each other, and having a plurality of light emitting elements on the first surface; a mounting member disposed to face a portion of the second surface of the substrate; and a base adhered to the second surface of the substrate, and having a depressed portion that faces the mounting member.

An imaging device according to one embodiment of the disclosure includes: a substrate having a first surface and a second surface that face each other, and having a plurality of light receiving elements on the first surface; a mounting member disposed to face a portion of the second surface of the substrate; and a base adhered to the second surface of the substrate, and having a depressed portion that faces the mounting member.

In the display device according to one embodiment of the disclosure, in a configuration in which the light emitting elements are disposed on the first surface of the substrate and the mounting member is disposed to face the second surface, the base having the depressed portion that faces the mounting member is adhered to the second surface of the substrate. Thereby, the whole rigidity thereof is increased and occurrence of deformation such as warpage caused by a change in temperature or humidity becomes difficult.

In the imaging device according to one embodiment of the disclosure, in a configuration in which the light receiving elements are disposed on the first surface of the substrate and the mounting member is disposed to face the second surface, the base having the depressed portion that faces the mounting member is adhered to the second surface of the substrate. Thereby, the whole rigidity thereof is increased and occurrence of deformation such as warpage caused by a change in temperature or humidity becomes difficult.

According to the display device in one embodiment of the disclosure, in the configuration in which the light emitting elements are disposed on the first surface of the substrate and the mounting member is disposed to face the second surface, the base having the depressed portion that faces the mounting member is adhered to the second surface of the substrate. Thereby, it is possible to suppress the deformation of the substrate caused by the change in temperature or humidity and to suppress distortion of a screen. Accordingly, it becomes possible to reduce image quality deterioration caused by hygrothermal environment.

According to the imaging device in one embodiment of the disclosure, in the configuration in which the light receiving elements are disposed on the first surface of the substrate and the mounting member is disposed to face the second surface, the base having the depressed portion that faces the mounting member is adhered to the second surface of the substrate. Thereby, it is possible to suppress the deformation of the substrate caused by the change in temperature or humidity and to suppress distortion of the screen. Accordingly, it becomes possible to reduce image quality deterioration caused by hygrothermal environment.

Incidentally, the above-mentioned contents are one example of the disclosure. Effects of the disclosure are not limited to the above-described ones and may be other different effects and may further include other effects.

BRIEF DESCRIPTION OF THE DRAWINGS

FIG. 1 is a schematic cross-sectional view illustrating a configuration of a display device according to a first embodiment of the disclosure.

FIG. 2 is a schematic diagram illustrating another cross-sectional configuration of the display device illustrated in FIG. 1.

FIG. 3 is a schematic plan view illustrating one example of an adhesion layer (an adhesion layer 18) illustrated in FIG. 1.

FIG. 4 is a characteristic diagram for describing warpage suppression effects before and after adhesion between a mounting member and a depressed portion.

FIG. 5A is a schematic cross-sectional view for describing a configuration according to an Example 1-1.

FIG. 5B is a schematic cross-sectional view for describing a configuration according to an Example 1-2.

FIG. 5C is a schematic cross-sectional view for describing a configuration according to an Example 1-3.

FIG. 5D is a schematic cross-sectional view for describing a configuration according to an Example 1-4.

FIG. 6 is a characteristic diagram illustrating a level of warping relative to a position in a substrate in respective cases of the Examples 1-1 to 1-4.

FIG. 7 is a schematic cross-sectional view illustrating a configuration of a display device according to a second embodiment of the disclosure.

FIG. 8 is a schematic cross-sectional view illustrating a configuration of a display device according to a third embodiment of the disclosure.

FIG. 9 is a schematic cross-sectional view illustrating a configuration of a display device according to a fourth embodiment of the disclosure.

FIG. 10 is a schematic cross-sectional view illustrating a configuration of a display device according to a fifth embodiment of the disclosure.

FIG. 11 is a schematic cross-sectional view illustrating a configuration of a display device according to a sixth embodiment of the disclosure.

FIG. 12 is a schematic cross-sectional view illustrating a configuration of a display device according to a seventh embodiment of the disclosure.

FIG. 13 is a schematic cross-sectional view illustrating a configuration of a display device according to an eighth embodiment of the disclosure.

FIG. 14 is a schematic cross-sectional view illustrating a configuration of a display device according to a ninth embodiment of the disclosure.

FIG. 15 is a schematic cross-sectional view illustrating a configuration of a display device according to a tenth embodiment of the disclosure.

FIG. 16A is a schematic cross-sectional view illustrating another configuration example of the display device illustrated in FIG. 15.

FIG. 16B is a schematic cross-sectional view illustrating another configuration example of the display device illustrated in FIG. 15.

FIG. 17 is a schematic plan view illustrating a configuration of an adhesion layer according to a first modification example.

FIG. 18 is a schematic plan view illustrating a configuration of an adhesion layer according to a second modification example.

FIG. 19 is a perspective view illustrating one example of the whole configuration of a display device.

FIG. 20 is a perspective view illustrating another example of the whole configuration of the display device.

FIG. 21 is a schematic cross-sectional view illustrating a configuration of an imaging device according to an eleventh embodiment of the disclosure.

DESCRIPTION OF EMBODIMENTS

In the following, embodiments of the disclosure will be described in detail with reference to the drawings. Incidentally, description will be made in the following order.

1. First Embodiment (an example of a display device in which a base is adhered to a back surface of an element substrate and a mounting member mounted onto the back surface is adhered in a depressed portion of the base)

2. Second Embodiment (an example of a display device having a depression around a columnar member of the depressed portion)

3. Third Embodiment (an example of a display device in which the columnar member is formed in contact with the base)

4. Fourth Embodiment (an example of a display device in which the columnar member is formed in contact with the mounting member)

5. Fifth Embodiment (an example of a display device in which the columnar member and a second adhesion layer are made of the same material and formed so as to have the same thickness)

6. Sixth Embodiment (an example of a display device in which the columnar member and a filling layer are made of the same material and formed so as to have the same thickness)

7. Seventh Embodiment (an example of a display device in which the filling layer and the second adhesion layer are made of the same material and formed so as to have the same thickness)

8. Eight Embodiment (an example of a display device in which the columnar member, the filling layer, and the second adhesion layer are made of the same material and formed so as to have the same thickness)

9. Ninth Embodiment (an example of a display device in which the mounting member and the element substrate are adhered to each other by soldering)

10. Tenth Embodiment (an example of a display device in which the filling layer is configured by grease.

11. Modification Example 1 (an example of a case where the columnar member and the filling layer are disposed alternately and concentrically)

12. Modification Example 2 (an example of a case where the columnar members are disposed at equal intervals)

13. Eleventh Embodiment (an example of an imaging device in which the base is adhered to the back surface of the element substrate and the mounting member that is mounted onto the back surface is adhered in the depressed portion of the base)

<First Embodiment>

[Configuration]

FIG. 1 illustrates a cross-sectional configuration of a display device (a display device 1) according to a first embodiment of the disclosure. The display device 1 performs picture display on the basis of a picture signal that is input from the outside and is provided with an element substrate 11A and a mounting member 12. The element substrate 11A is the one in which a plurality of light emitting elements 10A are disposed on a first surface (a surface S1) of the substrate 11. The mounting member 12 is disposed to face a portion of a second surface (a surface S2) of a substrate 11 of the element substrate 11A.

The light emitting element 10A is configured by one chip including, for example, a light emitting diode (LED). The light emitting elements 10A are disposed on the surface S1 of the substrate 11, for example, at a predetermined pitch in a matrix.

The substrate 11 is desirably configured by, for example, a glass epoxy resin. This is because it is low-cost and it makes routing of wiring easy. The glass epoxy resin is susceptible to a change in temperature (or humidity) and causes deformation such as warpage with ease. However, in the present embodiment, it is possible to suppress such deformation as described later and therefore it is possible to favorably use the low-cost glass epoxy resin. However, it is possible to use various other materials (for example, glass and so forth) not limited to the glass epoxy resin as constituent materials of the substrate 11. The substrate 11 corresponds to one specific example of a "substrate" of the disclosure.

The mounting member 12 is a member on a surface of which, for example, a plurality of electronic components are mounted and includes, for example, a silicon (Si) chip and so forth. The mounting member 12 is electrically coupled to the light emitting elements 10A and a not illustrated pixel circuit that are disposed on the first surface (the surface S1) of the substrate 11 via a coupling layer 17. The mounting member 12 is not provided on the whole region of the second surface (the surface S2) of the substrate 11 but is provided in a selective region (a local region) that faces a portion of the surface S2 of the substrate 11, for example, as illustrated in FIG. 2. The coupling layer 17 is configured by, for example, ACF (Anisotropic Conduction Film), solder (described later) and so forth.

In the present embodiment, a base (a base 13) having a depressed portion (a depressed portion 13*a*) that faces such a mounting member 12 is provided. The base 13 is adhered to the surface S2 of the base 13, describing in detail, to a region of the surface S2 of the substrate 11 excluding the depressed portion 13*a*. An adhesion layer (an adhesion layer 14) is formed between the base 13 and the substrate 11. The adhesion layer 14 corresponds to one specific example of a "second adhesion layer" of the disclosure.

The adhesion layer 14 is configured by resin materials such as, for example, an epoxy-based resin, an acrylic-based resin, a silicone-based resin, and a urethane-based resin. Alternatively, the adhesion layer 14 may be configured by other organic materials, inorganic materials and so forth not limited to such resin materials.

The base 13 is desirably configured by a material that is higher in rigidity than the substrate 11. As examples of the base 13, aluminum (Al), iron (Fe) and CFRP (Carbon Fiber Reinforced Plastics) may be given. A portion of the base 13 which faces the mounting member 12 is processed so as to have the depressed portion 13*a*. The base 13 is designed such that the mounting member 12 fits into the depressed portion 13*a* in a state in which the base 13 is adhered to the surface S2 of the substrate 11.

The mounting member 12 is adhered to the base 13 in the depressed portion 13*a*. In other words, an adhesion layer (an adhesion layer 18) is formed between the mounting member 12 and the base 13. Specifically, the mounting member 12 is adhered to the base 13 on a bottom surface of the depressed portion 13*a*. The adhesion layer 18 corresponds to one specific example of a "first adhesion layer" of the disclosure.

The adhesion layer 18 includes, for example, one or a plurality of columnar members 15 and a filling layer 16. The filling layer 16 is formed so as to fill at least a portion of a gap between the mounting member 12 and the base 13 (here, the bottom surface of the depressed portion 13*a*). The columnar member 15 is configured by resin materials such as, for example, the epoxy-based resin, the acrylic-based resin, the silicone-based resin, and the urethane-based resin. Alternatively, the columnar member 15 may be configured by other organic materials, inorganic materials and so forth not limited to such resin materials. The filling layer 16 is configured by resin materials such as, for example, the epoxy-based resin, the acrylic-based resin, the silicone-based resin, and the urethane-based resin. Alternatively, the filling layer 16 may be configured by other organic materials, inorganic materials and so forth not limited to such resin materials. In addition, a filler (a particulate matter) may be further added to the columnar member 15 and the filling layer 16. It is possible to adjust a cure shrinkage amount of the adhesion layer 18 in accordance with a combination of layouts, respective constituent materials, thicknesses and so forth of the columnar members 15 and the filling layer 16.

More desirably, the adhesion layer 18 is provided in a selective region that confronts the mounting member 12. In other words, it is desirable that the adhesion layer 18 be formed on a middle portion of the bottom surface of the depressed portion 13*a* and a region that corresponds to a side surface of the depressed portion 13*a* take the form of a void (a void 13*b*). Although details will be described later, this is because it is possible to suppress warping more effectively than a case where the adhesion layer 18 is formed in contact with the side surface.

The adhesion layer 14, the columnar member 15, and the filling layer 16 may be configured by mutually different materials or some or all of them may be configured by the same material as described later. In addition, there is no particular limitation also on thicknesses thereof. In addition, a thermosetting resin may be used or an ultraviolet curing resin may be used for the adhesion layers 14 and 18. However, the constituent materials, the thicknesses and so forth may be desirably set such that, for example, cure shrinkage amounts thereof become the same between the adhesion layer 14 and the adhesion layer 18.

FIG. 3 illustrates one example of a planar configuration (a configuration on a plane parallel with the surfaces S1 and S2 of the substrate 11) of the adhesion layer 18. Incidentally, a cross-sectional configuration on arrow along the I-I line in FIG. 3 corresponds to FIG. 1. The adhesion layer 18 is formed on a middle portion of the depressed portion 13*a* and the void 13*b* is provided between the adhesion layer 18 and the side surface of the depressed portion 13*a* in this way. In addition, the plurality (in this example, 5) of columnar members are disposed discretely in the adhesion layer 18 and the filling layer 16 is formed so as to fill the gap among them.

[Effects]

In the display device 1 according to the present embodiment, the plurality of light emitting elements 10A are disposed on the surface S1 of the substrate 11 of the element substrate 11A and the mounting member 12 is disposed to face a portion of the surface S2 of the substrate 11. In such a configuration, the base 13 having the depressed portion 13*a* that faces the mounting member 12 is adhered to the surface S2 of the substrate 11. Thereby, since the rigidity of the whole device is increased, occurrence of deformation such as warping caused by a change in environment such as temperature and humidity becomes difficult. In addition, also the deformation caused by temperature rising when driven, the thermal stress in the manufacturing process and so forth is suppressed. When the substrate 11 is deformed, a screen (a display screen) would be distorted and the image quality would be deteriorated. However, in the present embodiment, it is possible to suppress such image quality deterioration. Accordingly, it becomes possible to reduce image quality deterioration caused by hygrothermal environment.

In addition, in a structure in which the mounting member 12 is disposed to face a portion of the surface S2 of the substrate, the adhesion layer 14 is not formed in the region in which the mounting member 12 is disposed. Therefore, occurrence of warpage becomes easy in a local region in which the mounting member 12 is disposed. In contrast, it is possible to suppress such local deformation by causing the mounting member 12 and the base 13 to be adhered to each other in the depressed portion 13*a* of the base 13 as in the present embodiment.

For example, in a case (a broken line) where the adhesion layer 18 is present, it becomes possible to reduce an amount of warpage in comparison with a case (a solid line) where the adhesion layer 18 is absent, for example, as illustrated in FIG. 4. Incidentally, a distance between chips is set to 15 mm.

Although not particularly limited, a formation region for the adhesion layer 18 is desirably the selective region (having the void 13b) that confronts the mounting member 12 on the bottom surface of the depressed portion 13a. Here, a result of simulation of amounts of warpage in a case where the formation region for the adhesion layer 18 was changed as Examples 1-1 to 1-4 (FIG. 5A to FIG. 5D) is illustrated in FIG. 6. In the Example 1-1, the adhesion layer 18 was not provided. In the Example 1-2, the void 13b was ensured so as not to be in contact with the side surface of the depressed portion 13a and the adhesion layer 18 was provided in a region that confronts the mounting member 12. In addition, in the Example 1-3, the adhesion layer 18 was provided so as to cover the whole region of the depressed portion 13a. In the Example 1-4, the adhesion layer 18 was provided so as to fill the whole region of the depressed portion 13a.

As a result, in the Examples 1-2 to 1-4 in which the adhesion layer 18 was provided, the amount of warpage at a predetermined position was greatly reduced in comparison with the Example 1-1 in which the adhesion layer 18 is not provided as illustrated in FIG. 6. In addition, in the Example 1-3 in which the adhesion layer 18 was formed so as to cover the bottom surface of the depressed portion 13a, warpage was further suppressed in comparison with the Example 1-4 (×1 in FIG. 6) in which the adhesion layer 18 was formed so as to fill the whole region of the depressed portion 13a. In the Example 1-2 in which the adhesion layer 18 was formed with the void 13b being ensured, the amount warpage was more reduced than those in the other Examples 1-1, 1-3, and 1-4 and the most favorable result was obtained.

Next, other embodiments of the above-mentioned first embodiment and modification examples thereof will be described. In the following, the same symbols are assigned to the same constitutional elements as those in the above-mentioned first embodiment and description thereof is appropriately omitted.

<Second Embodiment>

FIG. 7 illustrates a cross-sectional configuration of a display device (a display device 1A) according to a second embodiment of the disclosure. The display device 1A performs picture display on the basis of the picture signal that is input from the outside and is provided with the element substrate 11A and the mounting member 12 similarly to the display device 1 according to the above-mentioned first embodiment. The plurality of light emitting elements 10A are disposed on the surface S1 of the substrate 11 and the mounting member 12 is disposed to face a portion of the surface S2.

In addition, the base 13 having the depressed portion 13a that faces the mounting member 12 is adhered to the surface S2 of the substrate 11 (describing in detail, to a region of the surface S2 of the substrate 11 excluding the depressed portion 13a).

Further, also in the present embodiment, the mounting member 12 is adhered to the base 13 in the depressed portion 13a and an adhesion layer (an adhesion layer 18A) is formed between the mounting member 12 and the base 13. Specifically, the mounting member 12 is adhered to the base 13 on the bottom surface of the depressed portion 13a. The adhesion layer 18A includes, for example, one or the plurality of columnar members 15 and the filling layer 16 similarly to the adhesion layer 18 according to the above-mentioned first embodiment. In addition, the adhesion layer 18A is provided in a selective region that confronts the mounting member 12 and a region that corresponds to the side surface of the depressed portion 13a is the void 13b.

However, in the present embodiment, a depression (a depression 13c) is formed in a region around the columnar member 15 (a region including a boundary between the columnar member 15 and the filling layer 16) on a surface (here, the bottom surface) that faces the columnar member 15 in the depressed portion 13a. The depression 13c is formed around the columnar member 15 so as to be, for example, groove-shaped and to have a predetermined depth. In addition, a void 150 is formed on a boundary portion between the columnar member 15 and the filling layer 16. Incidentally, the columnar member 15 and the filling layer 16 may be in contact with each other.

The plurality of light emitting elements 10A are disposed on the surface S1 of the substrate 11 and the mounting member 12 is disposed to face the portion of the surface S2 of the substrate 11 also in the display device 1A according to the present embodiment. In such a configuration, since the rigidity of the whole device is increased owing to adhesion, to the surface S2 of the substrate 11, of the base 13 having the depressed portion 13a that faces the mounting member 12, occurrence of deformation such as warpage caused by a change in temperature and so forth becomes difficult. In addition, it is possible to suppress local deformation owing to adhesion of the mounting member 12 and the base 13 in the depressed portion 13a. Thereby, it is possible to obtain effects equivalent to those of the above-mentioned first embodiment.

Further, in the present embodiment, the depression 13c is formed in the region around the columnar member 15 on the bottom surface of the depressed portion 13a. Thereby, it is possible to suppress mingling of the columnar member 15 with the filling layer 16 in the adhesion layer 18A. When the columnar member 15 mingles with the filling layer 16, there are cases where a time required for curing is changed or curing becomes insufficient and hence an adhesive failure occurs. In addition, there are also cases where a variation in cure shrinkage amount and unevenness occur in an adhesion layer plane. Mingling of the columnar member 15 with the filling layer 16 becomes difficult and occurrence of such adhesive failure and unevenness can be suppressed by having the void 150 between the columnar member 15 and the filling layer 16 as in the present embodiment.

<Third Embodiment>

FIG. 8 illustrates a cross-sectional configuration of a display device (a display device 1B) according to a third embodiment of the disclosure. The display device 1B performs picture display on the basis of the picture signal that is input from the outside and is provided with the element substrate 11A and the mounting member 12 similarly to the display device 1 according to the above-mentioned first embodiment. The plurality of light emitting elements 10A are disposed on the surface S1 of the substrate 11 and the mounting member 12 is disposed to face the portion of the surface S2.

In addition, the base 13 having the depressed portion 13a that faces the mounting member 12 is adhered to the surface S2 of the substrate 11 (describing in detail, to the region of the surface S2 of the substrate 11 excluding the depressed portion 13a).

Further, also in the present embodiment, the mounting member 12 is adhered to the base 13 in the depressed portion 13a and an adhesion layer (an adhesion layer 18B) is formed between the mounting member 12 and the base 13. Specifically, the mounting member 12 is adhered to the base 13 on the bottom surface of the depressed portion 13a. The adhesion layer 18B includes, for example, one or a plurality of columnar members (columnar member 15a) and the filling layer 16 similarly to the adhesion layer 18 according to the above-mentioned first embodiment. It is possible to use the materials similar to the constituent materials of the columnar member 15 according to the above-mentioned first embodiment as the columnar member 15a. The adhesion layer 18B is provided in the selective region that confronts the mounting member 12 and the region that corresponds to the side surface of the depressed portion 13a is the void 13b.

However, in the present embodiment, the columnar member 15a is formed in contact only with the base 13 (the depressed portion 13a) in the adhesion layer 18B unlike that of the above-mentioned first embodiment. The columnar member 15a is provided separately from the mounting member 12 and a gap between the columnar member 15a and the mounting member 12 is filled with the filling layer 16.

The plurality of light emitting elements 10A are disposed on the surface S1 of the substrate 11 and the mounting member 12 is disposed to face the portion of the surface S2 of the substrate 11 also in the display device 1B according to the present embodiment. In such a configuration, since the rigidity of the whole device is increased owing to adhesion, to the surface S2 of the substrate 11, of the base 13 having the depressed portion 13a that faces the mounting member 12, occurrence of deformation such as warpage caused by a change in temperature and so forth becomes difficult. In addition, it is possible to suppress local deformation owing to adhesion of the mounting member 12 and the base 13 in the depressed portion 13a. Thereby, it is possible to obtain effects equivalent to those of the above-mentioned first embodiment.

<Fourth Embodiment>

FIG. 9 illustrates a cross-sectional configuration of a display device (a display device 1C) according to a fourth embodiment of the disclosure. The display device 1C performs picture display on the basis of the picture signal that is input from the outside and is provided with the element substrate 11A and the mounting member 12 similarly to the display device 1 according to the above-mentioned first embodiment. The plurality of light emitting elements 10A are disposed on the surface S1 of the substrate 11 and the mounting member 12 is disposed to face the portion of the surface S2.

In addition, the base 13 having the depressed portion 13a that faces the mounting member 12 is adhered to the surface S2 of the substrate 11 (describing in detail, to the region of the surface S2 of the substrate 11 excluding the depressed portion 13a).

Further, also in the present embodiment, the mounting member 12 is adhered to the base 13 in the depressed portion 13a and an adhesion layer (an adhesion layer 18C) is formed between the mounting member 12 and the base 13. Specifically, the mounting member 12 is adhered to the base 13 on the bottom surface of the depressed portion 13a. The adhesion layer 18C includes, for example, one or a plurality of columnar members (columnar member 15b) and the filling layer 16 similarly to the adhesion layer 18 according to the above-mentioned first embodiment. It is possible to use the materials similar to the constituent materials of the columnar member 15 according to the above-mentioned first embodiment as the columnar member 15b. The adhesion layer 18C is provided in the selective region that confronts the mounting member 12 and the region that corresponds to the side surface of the depressed portion 13a is the void 13b.

However, in the present embodiment, the columnar member 15a is formed in contact only with the mounting member 12 in the adhesion layer 18C unlike that of the above-mentioned first embodiment. The columnar member 15b is provided separately from the base 13 (the bottom surface of the depressed portion 13a) and a gap between the columnar member 15a and the base 13 is filled with the filling layer 16.

The plurality of light emitting elements 10A are disposed on the surface S1 of the substrate 11 and the mounting member 12 is disposed to face the portion of the surface S2 of the substrate 11 also in the display device 1C according to the present embodiment. In such a configuration, since the rigidity of the whole device is increased owing to adhesion, to the surface S2 of the substrate 11, of the base 13 having the depressed portion 13a that faces the mounting member 12, occurrence of deformation such as warpage caused by a change in temperature and so forth becomes difficult. In addition, it is possible to suppress local deformation owing to adhesion of the mounting member 12 and the base 13 in the depressed portion 13a. Thereby, it is possible to obtain effects equivalent to those of the above-mentioned first embodiment.

<Fifth Embodiment>

FIG. 10 illustrates a cross-sectional configuration of a display device (a display device 1D) according to a fifth embodiment of the disclosure. The display device 1D performs picture display on the basis of the picture signal that is input from the outside and is provided with the element substrate 11A and the mounting member 12 similarly to the display device 1 according to the above-mentioned first embodiment. The plurality of light emitting elements 10A are disposed on the surface S1 of the substrate 11 and the mounting member 12 is disposed to face the portion of the surface S2.

In addition, the base 13 having the depressed portion 13a that faces the mounting member 12 is adhered to the surface S2 of the substrate 11 (describing in detail, to the region of the surface S2 of the substrate 11 excluding the depressed portion 13a). An adhesion layer (an adhesion layer 14a) is formed between the substrate 11 and the base 13.

Further, also in the present embodiment, the mounting member 12 is adhered to the base 13 in the depressed portion 13a and an adhesion layer (an adhesion layer 18D) is formed between the mounting member 12 and the base 13. Specifically, the mounting member 12 is adhered to the base 13 on the bottom surface of the depressed portion 13a. The adhesion layer 18D includes, for example, one or a plurality of columnar members (columnar member 15c) and the filling layer 16 similarly to the adhesion layer 18 according to the above-mentioned first embodiment. The adhesion layer 18D is provided in the selective region that confronts the mounting member 12 and the region that corresponds to the side surface of the depressed portion 13a is the void 13b.

However, in the present embodiment, the columnar member 15c and the adhesion layer 14a are made of the same material and have the same thickness (t1).

The plurality of light emitting elements 10A are disposed on the surface S1 of the substrate 11 and the mounting member 12 is disposed to face the portion of the surface S2 of the substrate 11 also in the present embodiment. In such a configuration, since the rigidity of the whole device is increased owing to adhesion, to the surface S2 of the substrate 11, of the base 13 having the depressed portion 13a that faces the mounting member 12, occurrence of deformation such as warpage caused by a change in temperature and so forth becomes difficult. In addition, it is possible to suppress local deformation owing to adhesion of the mounting member 12 and the base 13 in the depressed portion 13a. Thereby, it is possible to obtain effects equivalent to those of the above-mentioned first embodiment.

In addition, since the columnar member 15c and the adhesion layer 14a are made of the same material and have the same thickness, a thermal expansion difference between the columnar member 15c and the adhesion layer 14a is reduced, making it possible to effectively suppress warpage.

<Sixth Embodiment>

FIG. 11 illustrates a cross-sectional configuration of a display device (a display device 1E) according to a sixth embodiment of the disclosure. The display device 1E performs picture display on the basis of the picture signal that is input from the outside and is provided with the element substrate 11A and the mounting member 12 similarly to the display device 1 according to the above-mentioned first embodiment. The plurality of light emitting elements 10A are disposed on the surface S1 of the substrate 11 and the mounting member 12 is disposed to face the portion of the surface S2.

In addition, the base 13 having the depressed portion 13a that faces the mounting member 12 is adhered to the surface S2 of the substrate 11 (describing in detail, to the region of the surface S2 of the substrate 11 excluding the depressed portion 13a). The adhesion layer 14 is formed between the substrate 11 and the base 13.

Further, also in the present embodiment, the mounting member 12 is adhered to the base 13 in the depressed portion 13a and an adhesion layer (an adhesion layer 18E) is formed between the mounting member 12 and the base 13. Specifically, the mounting member 12 is adhered to the base 13 on the bottom surface of the depressed portion 13a. The adhesion layer 18E is provided in the selective region that confronts the mounting member 12 and the region that corresponds to the side surface of the depressed portion 13a is the void 13b similarly to the adhesion layer 18 according to the above-mentioned first embodiment.

However, in the present embodiment, the columnar member 15 and the filling layer 16 according to the above-mentioned first embodiment are made of the same material and have the same thickness. That is, the adhesion layer 18E is not divided into a columnar part and a filling material and takes the form of a single layer. In this case, it is possible to adjust a cure shrinkage amount of the adhesion layer 18E by containing filler into the adhesion layer 18E and adjusting a content of the filler.

The plurality of light emitting elements 10A are disposed on the surface S1 of the substrate 11 and the mounting member 12 is disposed to face the portion of the surface S2 of the substrate 11 also in the present embodiment. In such a configuration, since the rigidity of the whole device is increased owing to adhesion, to the surface S2 of the substrate 11, of the base 13 having the depressed portion 13a that faces the mounting member 12, occurrence of deformation such as warpage caused by a change in temperature and so forth becomes difficult. In addition, it is possible to suppress local deformation owing to adhesion of the mounting member 12 and the base 13 in the depressed portion 13a. Thereby, it is possible to obtain effects equivalent to those of the above-mentioned first embodiment.

In addition, since the adhesion layer 18E is provided (that is, the columnar member 15 and the filling layer 16 according to the above-mentioned first embodiment are made of the same material and have the same thickness), a thermal expansion difference between the columnar member 15 and the filling layer 16 is reduced, making it possible to effectively suppress warpage.

<Seventh Embodiment>

FIG. 12 illustrates a cross-sectional configuration of a display device (a display device 1F) according to a seventh embodiment of the disclosure. The display device 1F performs picture display on the basis of the picture signal that is input from the outside and is provided with the element substrate 11A and the mounting member 12 similarly to the display device 1 according to the above-mentioned first embodiment. The plurality of light emitting elements 10A are disposed on the surface S1 of the substrate 11 and the mounting member 12 is disposed to face the portion of the surface S2.

In addition, the base 13 having the depressed portion 13a that faces the mounting member 12 is adhered to the surface S2 of the substrate 11 (describing in detail, to the region of the surface S2 of the substrate 11 excluding the depressed portion 13a). An adhesion layer (an adhesion layer 14b) is formed between the substrate 11 and the base 13.

Further, also in the present embodiment, the mounting member 12 is adhered to the base 13 in the depressed portion 13a and an adhesion layer (an adhesion layer 18F) is formed between the mounting member 12 and the base 13. Specifically, the mounting member 12 is adhered to the base 13 on the bottom surface of the depressed portion 13a. The adhesion layer 18F includes, for example, one or the plurality of columnar members 15 and a filling layer (a filling layer 16a) similarly to the adhesion layer 18 according to the above-mentioned first embodiment. The adhesion layer 18F is provided in the selective region that confronts the mounting member 12 and the region that corresponds to the side surface of the depressed portion 13a is the void 13b.

However, in the present embodiment, the filling layer 16a and the adhesion layer 14b are made of the same material and have the same thickness (t2).

The plurality of light emitting elements 10A are disposed on the surface S1 of the substrate 11 and the mounting member 12 is disposed to face the portion of the surface S2 of the substrate 11 also in the present embodiment. In such a configuration, since the rigidity of the whole device is increased owing to adhesion, to the surface S2 of the substrate 11, of the base 13 having the depressed portion 13a that faces the mounting member 12, occurrence of deformation such as warpage caused by a change in temperature and so forth becomes difficult. In addition, it is possible to suppress local deformation owing to adhesion of the mounting member 12 and the base 13 in the depressed portion 13a. Thereby, it is possible to obtain effects equivalent to those of the above-mentioned first embodiment.

In addition, since the filling layer 16a and the adhesion layer 14b are made of the same material and have the same thickness, a thermal expansion difference between the filling layer 16a and the adhesion layer 14b is reduced, making it possible to effectively suppress warpage.

<Eighth Embodiment>

FIG. 13 illustrates a cross-sectional configuration of a display device (a display device 1G) according to an eighth embodiment of the disclosure. The display device 1G performs picture display on the basis of the picture signal that is input from the outside and is provided with the element substrate 11A and the mounting member 12 similarly to the display device 1 according to the above-mentioned first embodiment. The plurality of light emitting elements 10A are disposed on the surface S1 of the substrate 11 and the mounting member 12 is disposed to face the portion of the surface S2.

In addition, the base 13 having the depressed portion 13a that faces the mounting member 12 is adhered to the surface S2 of the substrate 11 (describing in detail, to the region of the surface S2 of the substrate 11 excluding the depressed portion 13a). An adhesion layer (an adhesion layer 14c) is formed between the substrate 11 and the base 13.

Further, also in the present embodiment, the mounting member 12 is adhered to the base 13 in the depressed portion 13a and an adhesion layer (an adhesion layer 18G) is formed between the mounting member 12 and the base 13. Specifically, the mounting member 12 is adhered to the base 13 on the bottom surface of the depressed portion 13a. The adhesion layer 18G is provided in the selective region that confronts the mounting member 12 and the region that corresponds to the side surface of the depressed portion 13a is the void 13b similarly to the adhesion layer 18 according to the above-mentioned first embodiment.

However, in the present embodiment, the columnar member 15 and the filling layer 16 according to the above-mentioned first embodiment, and the adhesion layer 14c are made of the same material and have the same thickness (t3). That is, the adhesion layer 18G is not divided into the columnar part and the filling material and takes the form of the single layer. In this case, it is possible to adjust a cure shrinkage amount of the adhesion layer 18E by containing the filler into the adhesion layer 18E and adjusting the content of the filler as with the adhesion layer 18E according to the above-described sixth embodiment.

The plurality of light emitting elements 10A are disposed on the surface S1 of the substrate 11 and the mounting member 12 is disposed to face the portion of the surface S2 of the substrate 11 also in the present embodiment. In such a configuration, since the rigidity of the whole device is increased owing to adhesion, to the surface S2 of the substrate 11, of the base 13 having the depressed portion 13a that faces the mounting member 12, occurrence of deformation such as warpage caused by a change in temperature and so forth becomes difficult. In addition, it is possible to suppress local deformation owing to adhesion of the mounting member 12 and the base 13 in the depressed portion 13a. Thereby, it is possible to obtain effects equivalent to those of the above-mentioned first embodiment.

In addition, since the columnar member 15 and the filling layer 16 according to the above-mentioned first embodiment, and the adhesion layer 14c are made of the same material and have the same thickness, a thermal expansion difference among the columnar member 15, the filling layer 16, and the adhesion layer 14c is reduced, making it possible to effectively suppress warpage.

<Ninth Embodiment>

FIG. 14 illustrates a cross-sectional configuration of a display device (a display device 1H) according to a ninth embodiment of the disclosure. The display device 1H performs picture display on the basis of the picture signal that is input from the outside and is provided with the element substrate 11A and the mounting member 12 similarly to the display device 1 according to the above-mentioned first embodiment. The plurality of light emitting elements 10A are disposed on the surface S1 of the substrate 11 and the mounting member 12 is disposed to face the portion of the surface S2.

In addition, the base 13 having the depressed portion 13a that faces the mounting member 12 is adhered to the surface S2 of the substrate 11 (describing in detail, to the region of the surface S2 of the substrate 11 excluding the depressed portion 13a). The adhesion layer 14 is formed between the substrate 11 and the base 13.

Further, also in the present embodiment, the mounting member 12 is adhered to the base 13 in the depressed portion 13a and the adhesion layer 18 is formed between the mounting member 12 and the base 13. Specifically, the mounting member 12 is adhered to the base 13 on the bottom surface of the depressed portion 13a.

However, in the present embodiment, the mounting member 12 is mounted onto the surface S2 side of the substrate 11 by soldering. A solder joint portion 17a is provided between the substrate 11 and the mounting member 12. The mounting member 12 may be mounted to the element substrate 11A by soldering in this way.

The plurality of light emitting elements 10A are disposed on the surface S1 of the substrate 11 and the mounting member 12 is disposed to face the portion of the surface S2 of the substrate 11 also in the present embodiment. In such a configuration, since the rigidity of the whole device is increased owing to adhesion, to the surface S2 of the substrate 11, of the base 13 having the depressed portion 13a that faces the mounting member 12, occurrence of deformation such as warpage caused by a change in temperature and so forth becomes difficult. In addition, it becomes possible to suppress local deformation owing to adhesion of the mounting member 12 and the base 13 in the depressed portion 13a. Thereby, it is possible to obtain effects equivalent to those of the above-mentioned first embodiment.

In addition, since the columnar member 15 and the filling layer 16 according to the above-mentioned first embodiment, and the adhesion layer 14c are made of the same material and have the same thickness, a thermal expansion difference among the columnar member 15, the filling layer 16, and the adhesion layer 14c is reduced, making it possible to effectively suppress warpage.

<Tenth Embodiment>

FIG. 15 illustrates a cross-sectional configuration of a display device (a display device 1I) according to a tenth embodiment of the disclosure. The display device 1I performs picture display on the basis of the picture signal that is input from the outside and is provided with the element substrate 11A and the mounting member 12 similarly to the display device 1 according to the above-mentioned first embodiment. The plurality of light emitting elements 10A are disposed on the surface S1 of the substrate 11 and the mounting member 12 is disposed to face the portion of the surface S2.

In addition, the base 13 having the depressed portion 13a that faces the mounting member 12 is adhered to the surface S2 of the substrate 11 (describing in detail, to the region of the surface S2 of the substrate 11 excluding the depressed portion 13a). The adhesion layer 14 is formed between the substrate 11 and the base 13.

Further, also in the present embodiment, the mounting member 12 is adhered to the base 13 in the depressed portion 13a, and an adhesion layer (an adhesion layer 18H) is formed between the mounting member 12 and the base 13. Specifically, the mounting member 12 is adhered to the base 13 on the bottom surface of the depressed portion 13a. The adhesion layer 18H includes, for example, one or the plurality of columnar members 15 and a filling layer (a filling layer 16b) similarly to the adhesion layer 18 according to the above-mentioned first embodiment. The adhesion layer 18F is provided in the selective region that confronts the mounting member 12 and the region that corresponds to the side surface of the depressed portion 13a is the void 13b.

However, in the present embodiment, the filling layer 16b is made of grease (grease). The filling layer 16b is desirably made of thermally conductive grease. Incidentally, the filling layer 16b may be formed so as to fill the depressed portion 13a up to the position of a predetermined depth as illustrated in FIG. 16A, or may be formed so as to fill the whole region in the depressed portion 13a as illustrated in FIG. 16B.

The plurality of light emitting elements 10A are disposed on the surface S1 of the substrate 11 and the mounting member 12 is disposed to face the portion of the surface S2 of the substrate 11 also in the present embodiment. In such a configuration, since the rigidity of the whole device is increased owing to adhesion, to the surface S2 of the substrate 11, of the base 13 having the depressed portion 13a that faces the mounting member 12, occurrence of deformation such as warpage caused by a change in temperature and so forth becomes difficult. In addition, it becomes possible to suppress local deformation owing to adhesion of the mounting member 12 and the base 13 in the depressed portion 13a. Thereby, it is possible to obtain effects equivalent to those of the above-mentioned first embodiment.

In addition, since the filling layer 16b in the adhesion layer 18H is made of the thermally conductive grease, it becomes possible to increase heat dissipation of the element substrate 11A. It becomes possible to suppress occurrence of temperature irregularity of the substrate 11 caused by heat regeneration from the mounting member 12 and so forth. Accordingly, it is possible to suppress distortion of the screen and to reduce temperature irregularity of the substrate 11, suppressing image quality deterioration more advantageously.

<Modification Example 1>

FIG. 17 illustrates a planar configuration of an adhesion layer according to a modification example (a modification example 1) of the above-mentioned first embodiment and so forth. Although a case is exemplified where the plurality of the columnar members 15 are disposed discretely and the filling layer 16 is formed so as to fill the gap among the columnar members 15 in the adhesion layer 18 according to the above-mentioned first embodiment, the layout of the adhesion layer is not limited thereto. For example, a columnar member (a columnar member 15d) and a filling layer (a filling layer 16c) may be disposed alternately and concentrically (or concentric-elliptically) as in the present modification example. Incidentally, in this example, an outer edge portion of the filling layer 16c is shaped into a rectangular form corresponding to the planer shape of the mounting member 12. In addition, the void 13b is provided between the outer edge portion of the filling layer 16c and the side surface of the depressed portion 13a.

It is possible to effectively suppress warpage using the columnar member 15d having the smaller ground contact area by disposing the columnar member 15d and the filling layer 16c alternately and concentrically in this way.

<Modification Example 2>

FIG. 18 illustrates a planar configuration of an adhesion layer according to a modification example (a modification example 2) of the above-mentioned first embodiment and so forth. Although description is given in which the plurality of the columnar members 15 are disposed discretely in the adhesion layer 18 according to the above-mentioned first embodiment, a plurality of columnar members (columnar members 15e) are desirably disposed at equal intervals (an interval p) as in the present modification example. It is possible to effectively suppress warpage using the columnar member 15d of the smaller ground contact area by disposing the columnar members 15e at equal intervals.

Incidentally, the layout of the columnar members and the filling layer in the adhesion layer may have various forms other than those in the above-mentioned modification examples 1 and 2. For example, the surface shape (the shape of a plane parallel with the substrate 11) of the columnar member may have other shapes such as a polygonal shape not limited to the above-mentioned circular shape. In addition, the number, the size and so forth of the columnar members are not limited to those of the above-mentioned examples.

<Application Example>

The display device 1 and so forth described in the above-mentioned embodiments and so forth may be, for example, the one that displays a picture image using an upper surface of the element substrate 11A as a display region 10 like a display device 2 illustrated in FIG. 19 or may be used as a tiling display 3 as illustrated in FIG. 20. The tiling display 3 is the one in which one display device 1 is set as a unit (a cell) and the plurality of display devices 1 are disposed, for example, in a matrix. In particular, in a case where the LEDs are used as the light emitting elements 10A, it is possible to achieve a large-size display by such tiling.

<Eleventh Embodiment>

FIG. 21 illustrates a cross-sectional configuration of an imaging device (an imaging device 4) according to an eleventh embodiment of the disclosure. The imaging device 4 acquires image data on the basis of entering light rays and is provided with an element substrate 21A and the mounting member 12. The element substrate 21A is the one in which a plurality of light receiving elements 20A are disposed on the surface S1 of a substrate 21. The mounting member 12 is disposed to face a portion of the surface S2 of the substrate 21 of the element substrate 21A.

The light receiving element 20A is configured by a chip including a photoelectric conversion element such as, for example, a photodiode (PD). The light receiving elements 20A are disposed on the surface S1 of the substrate 21, for example, at a predetermined pitch in a matrix. The substrate 21 is desirably made of, for example, the glass epoxy resin for a reason similar to that of the substrate 11 according to the above-mentioned first embodiment. Since it is possible to suppress deformation of the substrate 21 also in the present embodiment similarly to the above-mentioned first embodiment, it is possible to preferably use the glass epoxy resin as a material.

In addition, the base 13 having the depressed portion 13a that faces the mounting member 12 is provided also in the present embodiment. The base 13 is adhered to the surface S2 of the substrate 21, describing in detail, to the region of the surface S2 of the substrate 21 excluding the depressed portion 13a. The adhesion layer 14 is formed between the base 13 and the substrate 21.

Further, the mounting member 12 is adhered to the base 13 in the depressed portion 13a and the adhesion layer 18 is formed between the mounting member 12 and the base 13. The adhesion layer 18 includes, for example, one or the plurality of columnar members 15 and the filling layer 16 as described above. The adhesion layer 18 is provided in the selective region that confronts the mounting member 12 and the region corresponding to the side surface of the depressed portion 13a is the void 13b.

It is possible to increase the rigidity of the whole device owing to adhesion of the base 13 also to the element substrate 21A in which the light receiving elements 20A are disposed on the surface S1 of the substrate 21 in this way.

Accordingly, it is possible to obtain effects equivalent to those of the above-mentioned first embodiment.

Although, in the foregoing, description has been made by referring to the embodiments and the modification examples, the contents of the disclosure are not limited to the above-mentioned embodiments and so forth and various modifications are possible. For example, shapes and layouts of the depressed portion, the columnar member, the filling layer and so forth of the base are not limited to those illustrated in the above-mentioned embodiments and so forth. In addition, the materials, the thicknesses and so forth of respective constitutional elements are mere examples.

In addition, the effects described in the above-mentioned embodiments and so forth are merely one example. Effects may be other effects, or may further contain other effects.

Incidentally, the disclosure may also have such configurations as follows.

(1)

A display device including:

a substrate having a first surface and a second surface that face each other, and having a plurality of light emitting elements on the first surface;

a mounting member disposed to face a portion of the second surface of the substrate; and a base adhered to the second surface of the substrate, and having a depressed portion that faces the mounting member.

(2)

The display device according to (1), further including a first adhesion layer that causes the mounting member and the base to be adhered to each other in the depressed portion of the base.

(3)

The display device according to (2), in which the first adhesion layer includes one or a plurality of columnar members.

(4)

The display device according to (3), in which the first adhesion layer includes a filling layer that fills at least a portion of a gap between the mounting member and the base.

(5)

The display device according to (2) or (3), in which the first adhesion layer is provided on a bottom surface of the depressed portion, and the mounting member is adhered to the base on the bottom surface of the depressed portion.

(6)

The display device according to (5), in which a region that corresponds to a side surface of the depressed portion is a void.

(7)

The display device according to any one of (4) to (6), in which a region of a surface of the depressed portion has a depression, the surface facing the columnar member, the region being located around the columnar member.

(8)

The display device according to any one of (3) to (7), in which the columnar member is disposed in contact with one or both of the base and the mounting member.

(9)

The display device according to any one of (4) to (8), further including a second adhesion layer provided between the base and the substrate, in which the first adhesion layer and the second adhesion layer are same as each other in cure shrinkage amount.

(10)

The display device according to any one of (4) to (8), further including a second adhesion layer provided between the base and the substrate, in which the columnar member and the second adhesion layer are made of same material and have same thickness.

(11)

The display device according to any one of (4) to (8), further including a second adhesion layer provided between the base and the substrate, in which the columnar member and the filling layer are made of same material as each other and have same thickness as each other.

(12)

The display device according to any one of (4) to (8), further including a second adhesion layer provided between the base and the substrate, in which the filling layer and the second adhesion layer are made of same material as each other and have same thickness as each other.

(13)

The display device according to any one of (4) to (8), further including a second adhesion layer provided between the base and the substrate, in which the columnar member, the filling layer, and the second adhesion layer are made of same material as each other and have same thickness as each other.

(14)

The display device according to any one of (1) to (13), in which the mounting member is coupled to the substrate by soldering.

(15)

The display device according to (4), in which the filling layer contains grease having thermal conductivity.

(16)

The display device according to (4), in which the first adhesion layer is formed to cover a bottom surface of the depressed portion.

(17)

The display device according to (4), in which the first adhesion layer is formed to fill inside the depressed portion.

(18)

The display device according to (4), in which the columnar member and the filling layer are provided alternately and concentrically.

(19)

The display device according to (3), in which the columnar member includes a plurality of columnar members, and the plurality of columnar members are disposed at equal intervals.

(20)

An imaging device including:

a substrate having a first surface and a second surface that face each other, and having a plurality of light receiving elements on the first surface;

a mounting member disposed to face a portion of the second surface of the substrate; and a base adhered to the second surface of the substrate, and having a depressed portion that faces the mounting member.

The present application is based on and claims priority from Japanese Patent Application No. 2015-039922 filed with the Japan Patent Office on Mar. 2, 2015, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A display device comprising:
a substrate having a first surface and a second surface, and having a plurality of light emitting elements on the first surface;
a mounting member disposed to face a portion of the second surface of the substrate;
a base adhered to the second surface of the substrate, and having a depressed portion that faces the mounting member; and
a first adhesion layer that causes the mounting member and the base to be adhered to each other in the depressed portion of the base.

2. The display device according to claim 1, wherein the first adhesion layer includes one or a plurality of columnar members.

3. The display device according to claim 2, wherein the first adhesion layer includes a filling layer that fills at least a portion of a gap between the mounting member and the base.

4. The display device according to claim 1, wherein
the first adhesion layer is provided on a bottom surface of the depressed portion, and
the mounting member is adhered to the base on the bottom surface of the depressed portion.

5. The display device according to claim 4, wherein a region that corresponds to a side surface of the depressed portion is a void.

6. The display device according to claim 3, wherein a region of a surface of the depressed portion has a depression, the surface facing the columnar member, the region being located around the columnar member.

7. The display device according to claim 2, wherein the columnar member is disposed in contact with one or both of the base and the mounting member.

8. The display device according to claim 3, further comprising a second adhesion layer provided between the base and the substrate, wherein
the first adhesion layer and the second adhesion layer are same as each other in cure shrinkage amount.

9. The display device according to claim 3, further comprising a second adhesion layer provided between the base and the substrate, wherein
the columnar member and the second adhesion layer are made of same material and have same thickness.

10. The display device according to claim 3, further comprising a second adhesion layer provided between the base and the substrate, wherein
the columnar member and the filling layer are made of same material as each other and have same thickness as each other.

11. The display device according to claim 3, further comprising a second adhesion layer provided between the base and the substrate, wherein
the filling layer and the second adhesion layer are made of same material as each other and have same thickness as each other.

12. The display device according to claim 3, further comprising a second adhesion layer provided between the base and the substrate, wherein
the columnar member, the filling layer, and the second adhesion layer are made of same material as each other and have same thickness as each other.

13. The display device according to claim 1, wherein the mounting member is coupled to the substrate by soldering.

14. The display device according to claim 3, wherein the filling layer contains grease having thermal conductivity.

15. The display device according to claim 3, wherein the first adhesion layer is formed to cover a bottom surface of the depressed portion.

16. The display device according to claim 3, wherein the first adhesion layer is formed to fill inside the depressed portion.

17. The display device according to claim 3, wherein the columnar member and the filling layer are provided alternately and concentrically.

18. The display device according to claim 2, wherein
the columnar member comprises a plurality of columnar members, and
the plurality of columnar members are disposed at equal intervals.

19. An imaging device comprising:
a substrate having a first surface and a second surface, and having a plurality of light receiving elements on the first surface;
a mounting member disposed to face a portion of the second surface of the substrate; and
a base adhered to the second surface of the substrate, and having a depressed portion that faces the mounting member.

* * * * *